United States Patent [19]

Shimizu

[11] Patent Number: 5,381,422
[45] Date of Patent: Jan. 10, 1995

[54] DEVICE FOR CORRECTING CODE ERROR

[75] Inventor: Tetsuya Shimizu, Yokohama, Japan

[73] Assignee: Canon Kabushiki Kaisha, Tokyo, Japan

[21] Appl. No.: 78,851

[22] Filed: Jun. 21, 1993

Related U.S. Application Data

[63] Continuation of Ser. No. 576,777, Sep. 4, 1990, abandoned.

[30] Foreign Application Priority Data

Sep. 5, 1989 [JP] Japan .................. 1-230710

[51] Int. Cl.⁶ .............. G06F 11/10; H03M 13/00
[52] U.S. Cl. ................... 371/37.4; 371/37.1
[58] Field of Search ............ 371/37.4, 37.2, 39.1, 371/37.1, 37.5, 2.1

[56] References Cited

U.S. PATENT DOCUMENTS

| | | | |
|---|---|---|---|
| 4,653,052 | 3/1987 | Dori et al. | 371/37.4 |
| 4,726,028 | 2/1988 | Himeno | 371/37.4 |
| 4,750,178 | 6/1988 | Sako et al. | 371/37.4 |
| 4,760,576 | 7/1988 | Sako | 371/37.4 |
| 4,881,232 | 11/1989 | Sako et al. | 371/34.4 |
| 4,975,915 | 12/1990 | Sako et al. | 371/37.4 |
| 5,068,855 | 11/1991 | Kashida et al. | 371/37.4 |
| 5,070,503 | 12/1991 | Shikakura | 371/2.1 |

*Primary Examiner*—Charles E. Atkinson
*Assistant Examiner*—Phung My Chung
*Attorney, Agent, or Firm*—Fitzpatrick, Cella, Harper & Scinto

[57] ABSTRACT

A device receives a code train including information codes and first and second error correction codes which were provided by using the information codes, and then corrects code errors of the information codes. A first correcting circuit corrects code errors of the information codes in accordance with the first error correction check code, and a second correcting circuit corrects code errors of the information codes in accordance with the second error correction check code by deciding whether uncorrectable code errors are present or not in each predetermined number of information codes and generating flag information. The flag information is amended using the first error correction check code, and code errors of the information codes are concealed on the basis of the amended flag information.

10 Claims, 5 Drawing Sheets

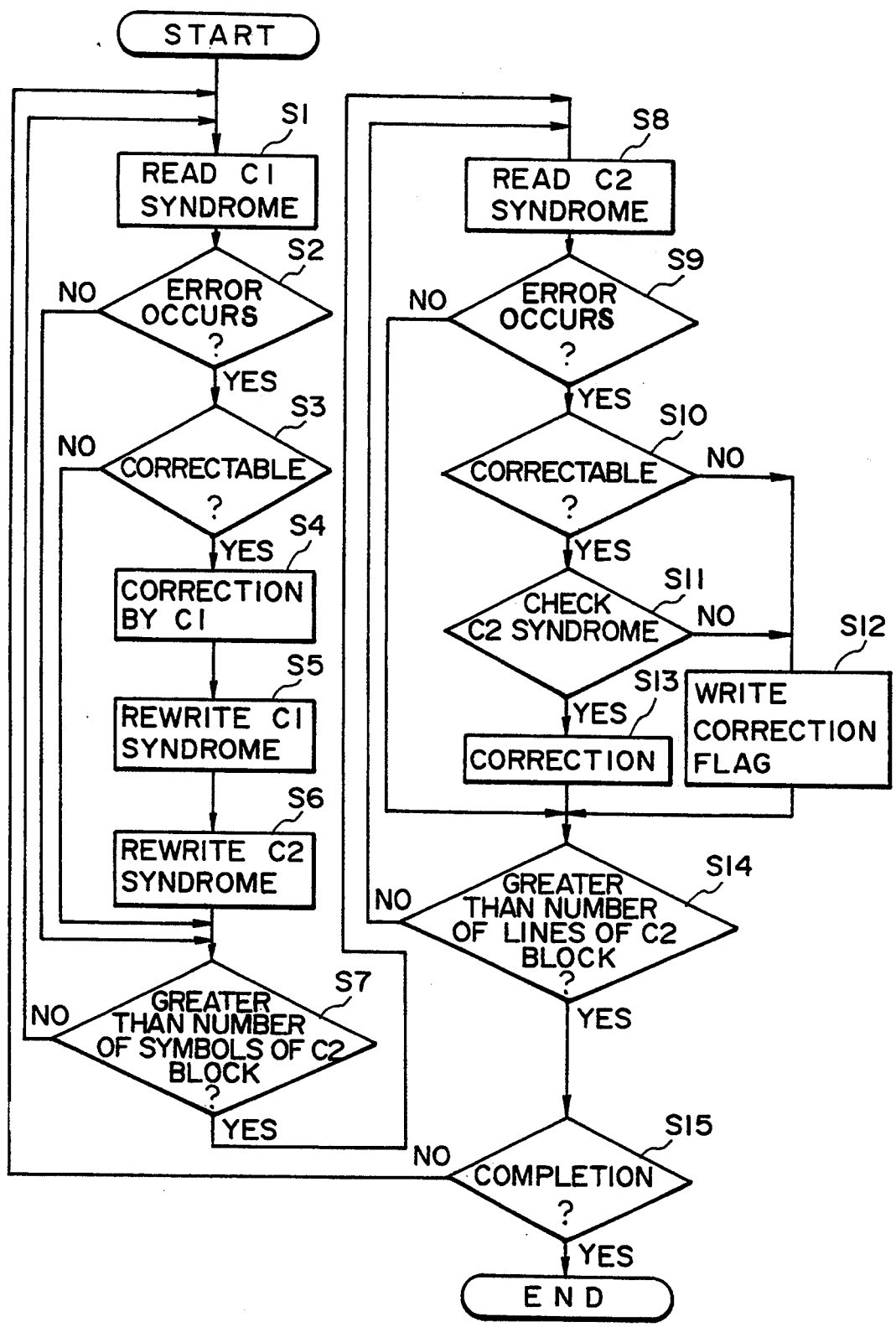
F I G. 6

DEVICE FOR CORRECTING CODE ERROR

This application is a continuation of application Ser. No. 07/576,777, filed Sep. 4, 1990, now abandoned.

BACKGROUND OF THE INVENTION

1. Field of the Invention

The present invention relates to a code error correcting device for decoding a code train which is obtained by error correction encoding digital information such as digital image information having a correlation by a chain-like encoding construction.

2. Related Background Art

Generally, a system for digitizing an information signal such as image information or the like and transmitting (recording) uses a method whereby the information signal is converted into a transmission code adapted to a transmission medium and transmitted. At this time, in many cases, input data is compressed and encoded due to a limitation of a transmission bit rate. On the other hand, as a countermeasure for the occurrence of transmission errors, an error correction code is added.

FIGS. 1A and 1B are schematic constructional block diagrams of a conventional digital information transmission system. FIG. 1A shows a transmitting system (recording system) and FIG. 1B shows a receiving system (reproducing system). In the transmitting system (recording system), a compression encoding circuit 10 compresses and encodes an information signal such as digital image information or the like by using its correlation. An output of the compression encoding circuit 10 is supplied to an error correction encoding circuit 12, by which an error correction encoding is executed as a counter-measure for transmission errors. A modulation circuit 14 modulates an output of the error correction encoding circuit 12 into a format adapted to characteristics of a transmission path and outputs it to the transmission path (records onto a recording medium).

On the other hand, in the receiving system (reproducing system), a demodulation circuit 16 demodulates the transmission signal of the transmission path. An error correction decoding circuit 18 corrects errors generated on the transmission path. An expansion circuit 20 executes expanding and reconstructing processes opposite to the processes of the compression encoding circuit 10. For data which is determined by the error correction decoding circuit 18 to be uncorrectable, error modification such as data substitution or the like is executed by an error modification circuit 22.

However, in the conventional example as mentioned above, in the case of executing the modifying operation in the error modification circuit 22, information to be modified must be determined on the basis of a compressing method by referring to a correction flag from the error correction decoding circuit 18. As mentioned above, error uncorrectable information cannot be merely discriminated by only the correction flag. A circuit to determine the information to be modified is inevitable as mentioned above. It is difficult to realize a high processing speed and to simplify a circuit construction.

SUMMARY OF THE INVENTION

The present invention is made in consideration of the background as mentioned above and it is an object of the invention to provide a code error correcting device in which a high processing speed and a simple circuit construction can be realized and the possibility of an erroneous operation in the correction of code errors is small.

To accomplish the above object, according to the invention in one embodiment, there is provided a device for receiving a code train including an information code and first and second error correction check codes which were produced by using the information code and for correcting code errors of the information code, comprising: (a) first correcting means for correcting the code errors of the information code in accordance with the first error correction check code; (b) second correcting means for correcting the code errors of the information code in accordance with the second error correction check code, the second correcting means discriminating whether the code errors can be corrected or not by using a predetermined number of information codes as a unit and generating discrimination information; (c) flag generating means for modifying the discrimination information by using the first error correction check code and for outputting flag information; and (d) modifying means for modifying the code train corresponding to the information code on the basis of the flag information.

The above and other objects and features of the present invention will become apparent from the following detailed description and the appended claims with reference to the accompanying drawings.

BRIEF DESCRIPTION OF THE DRAWINGS

FIG. 6 is a flowchart showing an algorithm of an error correction decoding process in the processing section of FIG. 5.

DETAILED DESCRIPTION OF THE PREFERRED EMBODIMENTS

An embodiment of the present invention will be described hereinbelow with reference to the drawings.

Figure 1A:
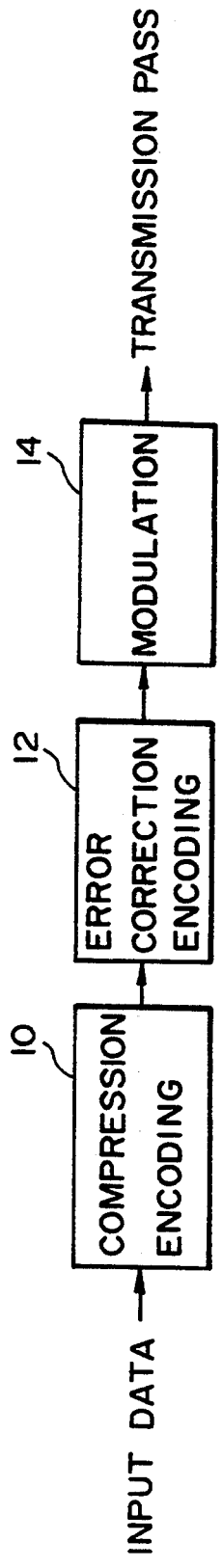
FIGS. 1A and 1B are diagrams showing a schematic construction of a conventional information transmission system.
Figure 1B:
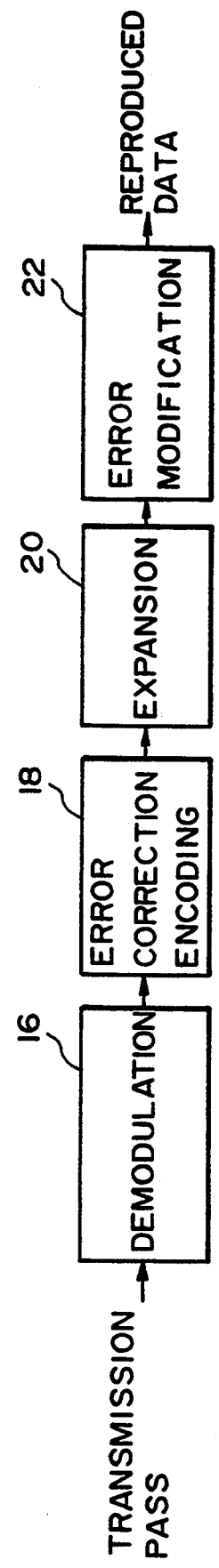
Figure 2A:
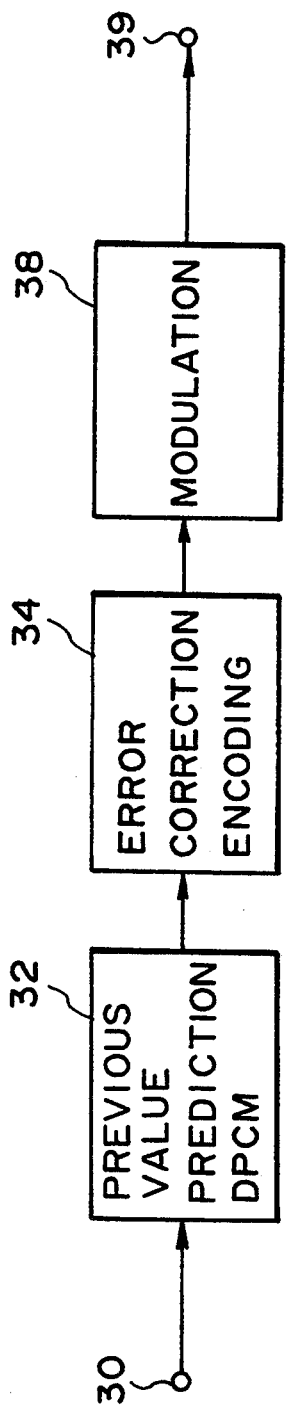
FIGS. 2A and 2B are diagrams showing a whole schematic construction of an information transmission system of an embodiment according to the invention.
Figure 2B:
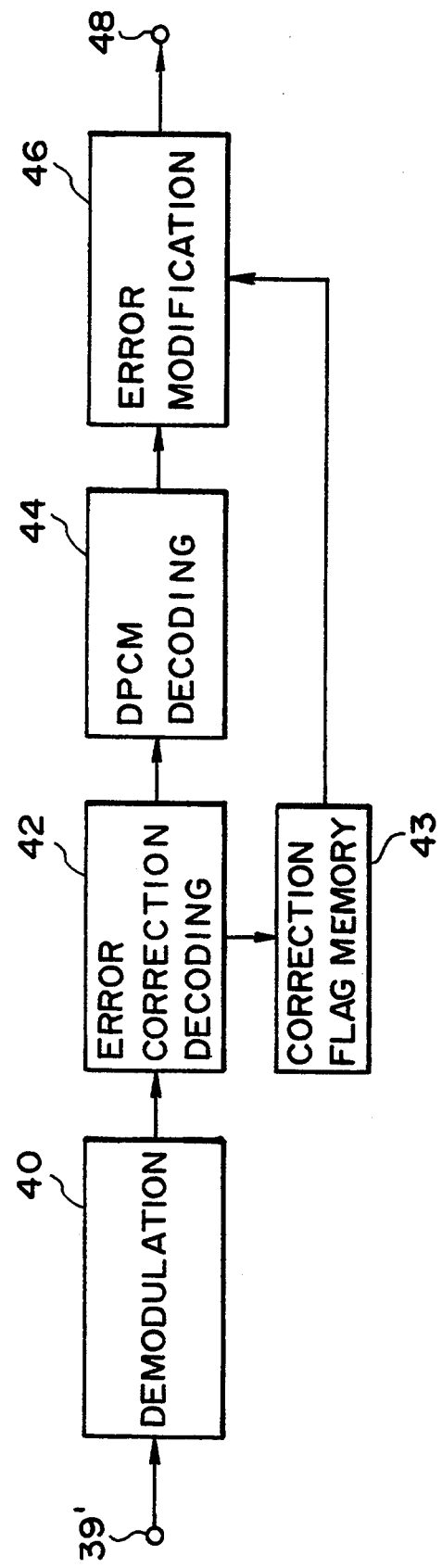

FIGS. 2A and 2B are schematic constructional block diagrams of an embodiment in the case where the invention was applied to an information transmission system in which a previous value prediction DPCM method is used as a compressing method of an information signal and a double encoding code is used as a chain-like encoding error correction code. FIG. 2A shows a transmitting system (recording system) and FIG. 2B shows a receiving system (reproducing system).

Figure 3:
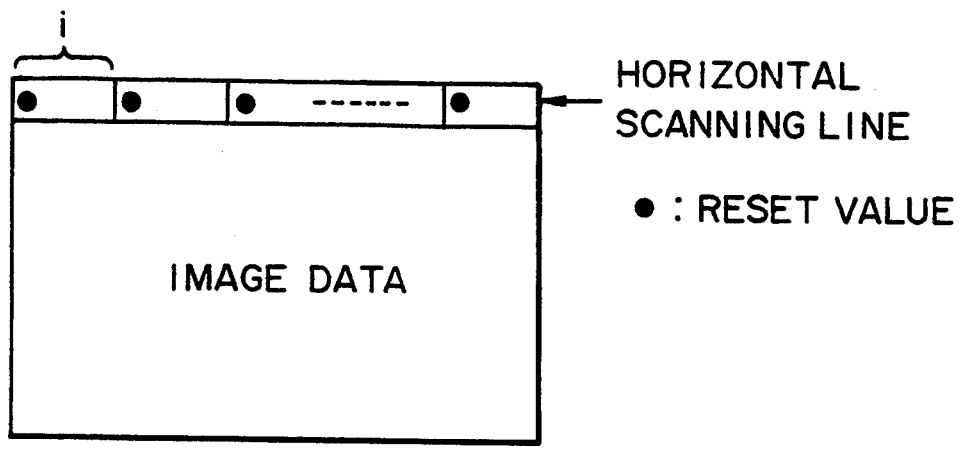
FIG. 3 is an explanatory diagram of a processing unit of a previous value prediction DPCM.

In FIG. 2A, an information signal such as a television signal in which a horizontally scanned image signal was digitized is input to an input terminal 30. A previous value prediction DPCM circuit 32 converts the digital image information signal of the input terminal 30 into a DPCM data train having a reset value every predetermined length i as shown in FIG. 3. In the embodiment, since a previous value prediction is used as a predicting method, the direction of the correlation which was used upon compression is set to the horizontal scanning direction.

Figure 4:
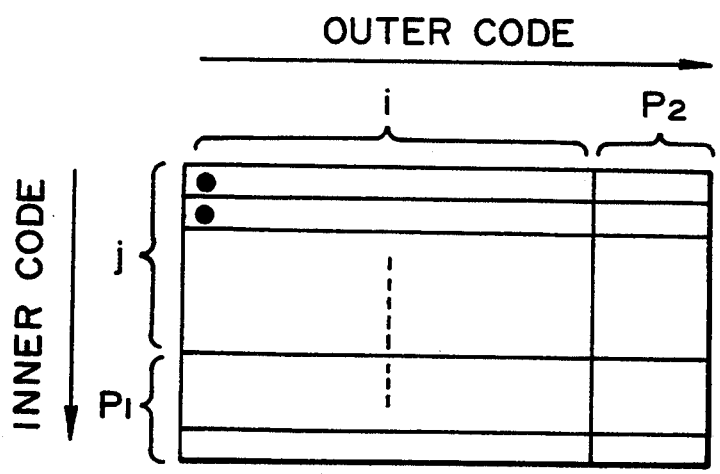
FIG. 4 is an explanatory diagram of an error correction encoding block.

A double encoded (chain-like encoded) error correction code is added by an error correction encoding circuit 34 to DPCM data obtained by the previous value prediction DPCM circuit 32. FIG. 4 shows a construction of a data train to which the error correction code was added. In the embodiment, an inner code is formed by adding a parity $P_1$ in the vertical direction of an image by using the information corresponding to j lines of the image information as a number of information points as shown in FIG. 4.

In the embodiment, an outer code is made to coincide with the horizontal scanning direction of the image data after completion of the DPCM, that is, in the direction of the correlation used upon compression of the information. The number of information points of the code is set to i as a unit of the DPCM data including a reset value. A parity $P_2$ is added and an outer code is formed in accordance with a well-known predetermined error correction code producing method. A Reed Solomon code or the like is considered appropriate as an error correction code which is used here.

The digital image information signal to which the error correction code was added as mentioned above is modulated into a format adapted to characteristics of a transmission path by a modulation circuit 38 and transmitted to the transmission path through a terminal 39. The transmitting order on the transmission path can be correctly known on the reception side and can be arbitrarily set so long as the image can be reconstructed.

The operation of a receiving system (reproducing system) shown in FIG. 2B will now be described. The signal received from the transmission path is input from a terminal 39' and demodulated by a demodulation circuit 40. In accordance with a predetermined algorithm as will be explained hereinlater, an error correction decoding circuit 42 decodes the inner code and corrects the errors which occurred on the transmission path as much as possible. Further, similarly to the inner code, the decoding circuit 42 decodes the outer code and executes the error correction in accordance with a predetermined algorithm.

Figure 5:
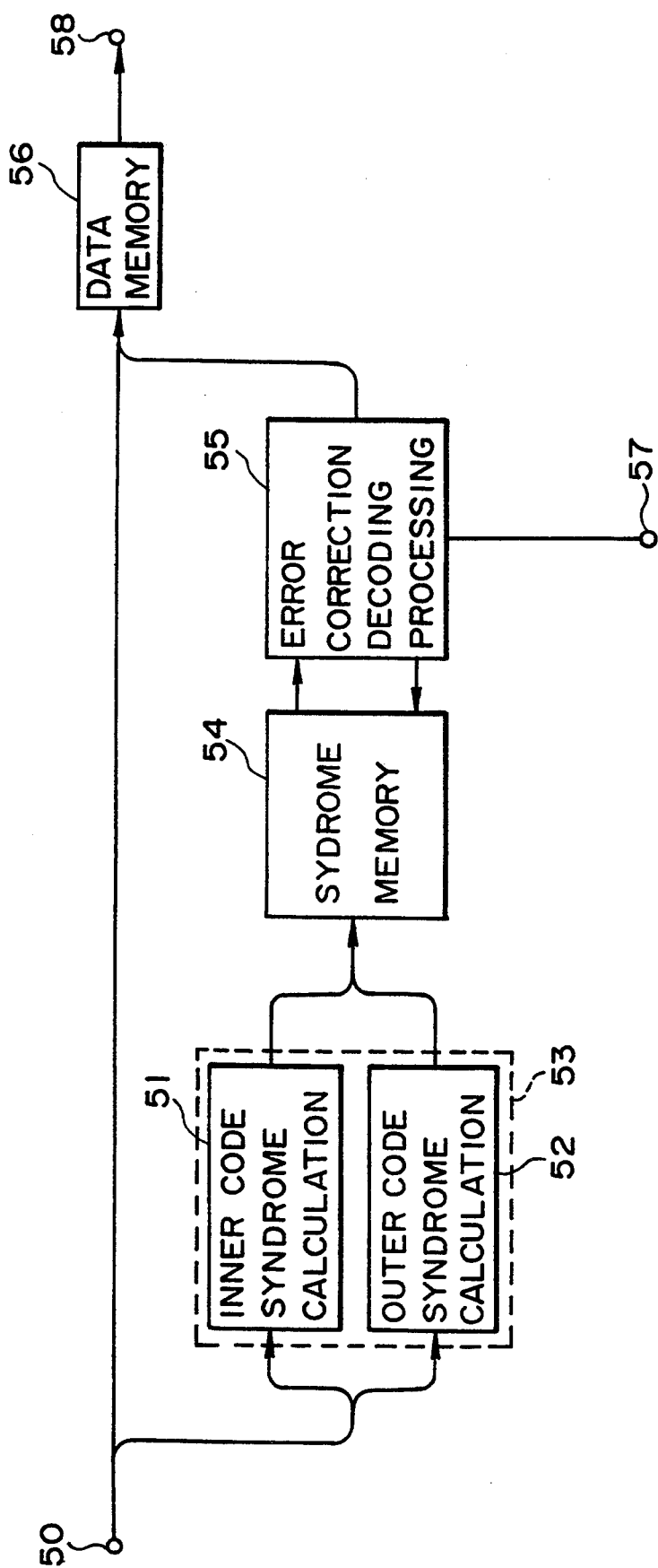
FIG. 5 is a diagram showing a construction of an error correction decoding processing section in the system of FIG. 2.

A practical operation of the error correction decoding circuit 42 will now be described. FIG. 5 shows an example of a construction of the error correction decoding circuit 42.

The code demodulated by the demodulation circuit 40 is supplied from a terminal 50 to a syndrome calculation section 53. Syndromes regarding the inner code and the outer code are calculated by an inner code syndrome calculation circuit 51 and an outer code syndrome calculation circuit 52, respectively. The calculated syndromes are written into a syndrome memory 54. The syndrome memory 54 can store the syndromes of two ECC blocks shown in FIG. 4. Simultaneously with the writing of the calculation result of the syndromes of the codes of the ECC block received, the calculation result of the syndromes of the ECC block which had been written before can be read out.

An error correction decoding processing section 55 includes a microprocessor and the like and can be controlled by software. FIG. 6 is a flowchart showing a decoding algorithm of the error correction decoding processing section 55 of FIG. 5. The error correction is executed in accordance with the order of the inner code ($C_1$) and the outer code ($C_2$) on an ECC block unit basis shown in FIG. 4.

The decoding operation of the inner code will be first described with reference to FIG. 6. First, the $C_1$ syndrome is read out of the syndrome memory 54 (step S1). Only when correctable errors are found out in steps S2 and S3 is the data written in a data memory 56 corrected (S4). The above correcting operation is executed by processes such that the position and size of the errors are calculated by the readout syndromes and the erroneous data in the input data in the data memory 56 is rewritten on the basis of the results of the calculations.

After that, the $C_1$ and $C_2$ syndromes are rewritten in steps S5 and S6 in accordance with the rewritten data in the memory 56 because the values of the $C_1$ and $C_2$ syndromes are different. After the above process is executed with respect to all of the symbols (S7), the decoding process of the outer code is performed.

The decoding process of the outer code is executed in the following manner. First, the $C_2$ syndrome is read out of the syndrome memory 54 (S8). If it is determined in steps S9 and S10 that uncorrectable errors exist, step S12 follows and a correction flag is written into the corresponding portion in a correction flag memory 43 through a terminal 57. On the contrary, if it is determined that correctable errors exist, step S11 follows and the $C_2$ syndrome is checked. In step S11, in order to confirm that the position and size of the errors which were calculated by the correction processing calculations by the outer code $C_2$ are correct or not, the syndrome in the direction of the inner code $C_1$ at the calculated error position is read out and it is first confirmed that the syndrome is not 0. Such a confirming process is executed to see if errors are also detected at the position calculated by the outer code process on the inner code side or not. Then, the size of errors calculated by the outer code process is added to the syndrome on the inner code side and a check is made to see if the syndrome is 0 or not. However, in this case, if other errors remain in the direction of the inner code, the syndrome is not 0. Therefore, the above confirming process is properly used in accordance with an error ratio of the transmission path or a correcting capability of the error correction code.

The reason why the confirmation as mentioned above is executed will now be simply described. In the system such as a VTR or the like, if what is called a burst error has occurred, errors which are continuous in the direction (direction of the outer code $C_2$ in the embodiment) of the correlation which is used for compression occur. Therefore, the reliability of the result of the discrimination regarding whether the errors can be corrected or not which is based on the result of the decoding of the outer code which was encoded in the correlation direction is low. If a correction flag for error correction is formed in accordance with the result of the discrimination, the code which was corrected by the erroneous operation is directly output without being modified. In this case, an unpleasant wrong image is displayed as a reproduced image. Therefore, in the embodiment, the result of the discrimination is checked and modified on the basis of the decoding result of the inner code, thereby raising the reliability of the correction flag.

That is, if it is confirmed by the inner code $C_1$ that the discrimination result indicating that the error correction can be performed by the outer code $C_2$ is correct in step S11, the processing routine advances to step S13 and the error correcting operation is executed by the outer code $C_2$. On the other hand, if the discrimination result indicating that the error correction can be performed by the outer code $C_2$ is contradictory to the result of the calculation of the inner code, the above discrimination result is modified to the uncorrectable state. In step S12, the correction flag is written into the corresponding portion in the correction flag memory 43.

The code which was subjected to the error correcting process in the error correction decoding circuit 42 is supplied to the DPCM decoding circuit 44. The DPCM decoding circuit 44 decodes the DPCM code and reconstructs the image data.

Figure 7:
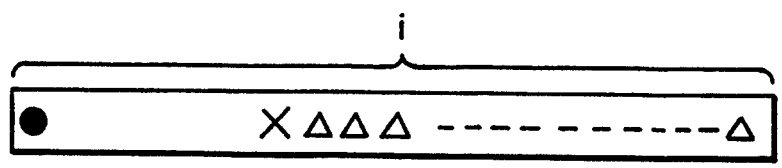
FIG. 7 is a diagram for explaining an error propagation upon DPCM decoding.

Consideration will now be made with respect to the case where errors still remain even in the decoding processes of both of the inner code $C_1$ and the outer code $C_2$, that is, the case where errors exceeding the correcting capability of the error correction code which was used here have occurred on the transmission path. As mentioned above, since the image data is compressed and encoded by the previous value prediction DPCM and the differential value between the present value and the previous value is transmitted, if any uncorrectable error remains in a group of data, as shown in FIG. 7, errors are propagated to the data having the residual errors and subsequent data in the data train of a length i which was segmented by one unit of the DPCM, that is, by a reset value. All of the data having the residual errors and subsequent data are regarded as wrong data. In FIG. 7, x indicates erroneous data and Δ denotes data which causes a DPCM decoding error because the data of x acts as a cause.

Discrimination regarding whether it is necessary to modify the output of the DPCM decoding circuit 44 or not can be made by reference to the correction flag by the outer code in which the reliability was improved by using the inner code as mentioned above. That is, in the embodiment, since a construction of the outer code has been equalized with the unit length of the DPCM as shown in FIG. 3, one correction flag is prepared every unit of the DPCM. By referring to the correction flag memory 43, it is possible to momentarily decide whether the output of the DPCM decoding circuit 44 is directly supplied to an output terminal 48 or the error correction is executed by a predetermined method. An error modification circuit 46 modifies the data train in which the errors remain as mentioned above on a data line unit basis of the length i. For instance, such an erroneous data train is modified by replacing the data of the line (length i) including the errors by using the data of the line just before or just after the erroneous line, or the like.

Although the previous value prediction DPCM has been used as a compressing method of the image information in the embodiment, the invention is not limited to such a method. That is, in the construction of the latter error correction code, a compressing method using the correlation direction which can be made to coincide with the direction constructing the error correction code which is finally decoded when the chain-like error correction code is decoded can be used in the invention. On the other hand, although the embodiment has been described with respect to the example of the case of double encoding as a chain-like error correction code, the invention is not limited to the double encoding but can be also applied to the case where a code is constructed in an n-multiplex manner.

As described above, according to the error correcting device of the invention, the direction of correlation in which the error correction circuit used the chain-like-encoded error correction code for the compression of the information is made coincident with the direction of the error correction code which is finally decoded. The discrimination result regarding whether the error correction can be performed by the finally decoded error correction code or not is modified by using other error correction code. The modifying operation of the error modification circuit is determined by using the correction flag according to the modified result. By using the above construction, the direction of the correlation used in the compression encoding when transmitting coincides with the constructing direction of the error correction code which is finally decoded upon decoding on the reception side. Therefore, the correction flag corresponds to the code to be modified. The modifying process of the error uncorrectable code can be executed at a high speed by a simple circuit construction. On the other hand, with respect to the code as well which was erroneously determined to be correctable by the error correction code which is finally decoded and was error corrected, the correction flag is modified by other error correction code, so that it is possible to modify by the information of a high correlation.

What is claimed is:

1. A device for receiving a code train including information codes and first and second error correction check codes which were provided by using the information codes and for correcting code errors of the information codes, comprising:
   (a) first correcting means for correcting code errors of the information codes in accordance with the first error correction check code;
   (b) second correcting means for correcting code errors of the information codes in accordance with the second error correction check code, said second correcting means deciding whether uncorrectable code errors are present or not in each predetermined number of information codes and generating flag information;
   (c) amending means for amending the flag information generated by said second correcting means, according to the first error correction check code used by said first correcting means and for generating amended flag information; and
   (d) concealing means for concealing code errors of the information codes in the code train on the basis of the amended flag information.

2. A device according to claim 1, wherein the information codes are provided by compressing digital information by using a correlation of the digital information and the second error correction code is provided by using information codes extracted in a direction of the correlation, and the device further including expanding means for expanding the information codes processed through the first and second error correcting means to reconstruct the digital information, and for supplying the reconstructed digital information to the concealing means.

3. A device according to claim 2, wherein the information codes are provided by a process of compressing the digital information and said process is completed for each predetermined amount of digital information.

4. A device according to claim 3, wherein said concealing means replaces a number of information codes corresponding to said predetermined amount of digital information with other codes.

5. A device according to claim 1, wherein the first error correction check code is provided by using the information codes and the second error correction check code.

6. A device according to claim 5, wherein the second error correcting means corrects the code errors of the information codes which have been corrected by the first error correcting means by using the second error correction check code corrected by the first error correcting means.

7. A device according to claim 6, wherein said amending means discriminates whether code errors are detected by the first error correction check code corresponding to an error position calculated by the second error correcting means or not.

8. A device for receiving a code train including a multiply-encoded error correction code provided by using information codes and for correcting code errors of the information codes, comprising:
   (a) error correcting means for correcting the code errors of the information codes in accordance with the multiply-encoded error correction code, said error correcting means deciding whether uncorrectable code errors are present or not in each predetermined number of information codes by using an error correction code which is finally decoded and generating flag information;
   (b) amending means for amending the flag information generated by said error correcting means, by using an error correction code other than the error correction code used in the decision by said error correcting means and for generating amended flag information; and
   (c) concealing means for concealing code errors of the information codes in the code train on the basis of the amended flag information.

9. A device according to claim 8, wherein the information codes are provided by compressing digital information by using a correlation of the digital information and the error correction code which is finally decoded is provided by using information codes extracted in a direction of the correlation, and the device further including expanding means for expanding the information codes processed through the error correcting means to reconstruct the digital information, and for supplying the reconstructed digital information to the concealing means.

10. A method for receiving a code train including an information code and first and second error correction check codes which were provided by using the information codes and for correcting code errors of the information codes, comprising the steps of:
   (a) correcting code errors of the information codes in accordance with the first error correction check code;
   (b) deciding whether uncorrectable code errors are present in each predetermined number of information codes by using the second error correction check code to generate flag information;
   (c) amending the flag information generated in said step (b) according to the first error correction check code used by said step (a) and generating amended flag information;
   (d) correcting code errors of the information codes in accordance with the second error correction check code; and
   (e) concealing code errors of the information codes in the code train on the basis of the amended flag information.

* * * * *